US012062478B2

(12) United States Patent
Pavanello et al.

(10) Patent No.: US 12,062,478 B2
(45) Date of Patent: Aug. 13, 2024

(54) ELECTRICAL DEVICE HAVING HEAT GENERATING COMPONENTS WITH IMPROVED HEAT REMOVAL USING TURBULENT FLOW

(71) Applicant: HITACHI ENERGY LTD, Zurich (CH)

(72) Inventors: Paolo Pavanello, Granze (IT); Roberto Zannol, Terme (IT)

( * ) Notice: Subject to any disclaimer, the term of this patent is extended or adjusted under 35 U.S.C. 154(b) by 736 days.

(21) Appl. No.: 16/605,251

(22) PCT Filed: May 10, 2017

(86) PCT No.: PCT/EP2017/061113
§ 371 (c)(1),
(2) Date: Oct. 15, 2019

(87) PCT Pub. No.: WO2018/206094
PCT Pub. Date: Nov. 15, 2018

(65) Prior Publication Data
US 2020/0126707 A1    Apr. 23, 2020

(51) Int. Cl.
| | |
|---|---|
| *H01F 27/20* | (2006.01) |
| *H01F 27/28* | (2006.01) |
| *H02K 9/197* | (2006.01) |
| *F28D 21/00* | (2006.01) |
| *H01L 23/46* | (2006.01) |

(52) U.S. Cl.
CPC .............. *H01F 27/20* (2013.01); *H01F 27/28* (2013.01); *H02K 9/197* (2013.01); *F28D 2021/0028* (2013.01); *H01L 23/46* (2013.01)

(58) Field of Classification Search
CPC .. H02K 9/19; H02K 9/197; F28D 2021/0028; H01F 27/12; H01F 27/20; H01F 27/28; H01L 23/46; F28F 13/12; F28F 13/18; F28F 13/02; F28F 7/00; F28F 2215/02; F28F 2215/04; H05K 7/20154; H05K 7/20418; H05K 7/20436; H05K 7/20854;
(Continued)

(56) References Cited

U.S. PATENT DOCUMENTS 3,421,578 A * 1/1969 Marton ................. H01F 27/085
165/80.3
3,579,162 A * 5/1971 Savkar ................... H01F 27/12
165/104.33
(Continued)

FOREIGN PATENT DOCUMENTS

| CH | 486757 A | 2/1970 |
|---|---|---|
| CN | 2514400 Y | 10/2002 |

(Continued)

OTHER PUBLICATIONS

Chinese Notification to Grant Patent Right For Invention with English Translation for Chinese Application No. 201780090474.1 dated Mar. 31, 2021, 3 pages.
(Continued)

*Primary Examiner* — Travis Ruby
(74) *Attorney, Agent, or Firm* — Sage Patent Group

(57) ABSTRACT

An electric device (1) comprises a portion generating heat and a portion for dissipating said generated heat by heat exchange with a fluid, wherein said heat dissipating portion comprises means for generating a turbulent flow in the fluid.

16 Claims, 5 Drawing Sheets

(58) Field of Classification Search
CPC .............. H05K 7/20863; H05K 7/209; H05K 7/20909; H05K 7/20
See application file for complete search history.

(56) References Cited

U.S. PATENT DOCUMENTS

| | | | | |
|---|---|---|---|---|
| 3,921,112 | A * | 11/1975 | Broverman | H01F 27/10 165/104.33 |
| 4,723,600 | A * | 2/1988 | Yokoyama | F28F 1/325 165/151 |
| 4,745,966 | A * | 5/1988 | Avery | H01F 27/025 165/104.33 |
| 5,161,088 | A | 11/1992 | Burgher et al. | |
| 5,709,263 | A | 1/1998 | Mira | |
| 6,050,329 | A * | 4/2000 | Durian | H01F 27/025 165/104.33 |
| 2001/0032718 | A1 | 10/2001 | Sheerin et al. | |
| 2007/0277994 | A1 | 12/2007 | Schafer | |
| 2008/0066888 | A1 | 3/2008 | Tong et al. | |
| 2013/0032323 | A1 | 2/2013 | Hsu | |

FOREIGN PATENT DOCUMENTS

| | | |
|---|---|---|
| CN | 1387618 A | 12/2002 |
| CN | 103090713 A | 5/2013 |
| CN | 103717992 A | 4/2014 |
| CN | 105392330 A | 3/2016 |
| CN | 105987630 A | 10/2016 |
| DE | 102004040949 A1 | 3/2006 |
| EP | 0500390 A1 | 8/1992 |
| EP | 3040670 A1 | 7/2016 |
| GB | 1457814 A | 12/1976 |
| JP | 6349185 U | 4/1985 |
| JP | 04102305 A | 4/1992 |
| JP | 07201598 A | 1/1995 |
| JP | 2004144460 B2 | 3/2003 |
| JP | 2001133172 B2 | 7/2003 |
| JP | 2016081844 B2 | 10/2014 |
| KR | 2002091090 Y1 | 10/2002 |
| KR | 101384568 B1 | 4/2014 |
| WO | 2008020806 A1 | 2/2008 |
| WO | 2014081140 A1 | 5/2014 |

OTHER PUBLICATIONS

European Patent Office, International Search Report for PCT/EP2017/061113. Search completed on Jun. 27, 2018.

Korean Notice of Grounds For Rejection with English Translation for Korean Patent Application No. 10-2019-7034081, dated May 22, 2021, 4 pages.

Japanese Notice of Reasons for Refusal with English translation for Japanese Patent Application No. 2019-555167 dated Jun. 23, 2021, 26 pages.

Chinese Office Action and Search Report with English Translation for Chinese Application No. 201780090474.1 dated Sep. 3, 2020, 16 pages.

* cited by examiner

ELECTRICAL DEVICE HAVING HEAT GENERATING COMPONENTS WITH IMPROVED HEAT REMOVAL USING TURBULENT FLOW

BACKGROUND

Technical Field

The present invention relates to heat removal in electric devices, such as liquid immersed and dry-type transformers, and parts thereof, motors, fans, or the like.

Description of the Related Art

In the transformers field, the transformer includes parts where heat is generated, such as the core and the windings. Heat is transferred from such parts to a fluid surrounding them and then eventually dissipated in the environment through a suitable cooling system. In general, the heat removal influences the dimensions of the cooling system and consequently the overall costs of the transformer.

Similar considerations apply in different electric devices such as motors or fans, wherein heat is removed by the air flowing around heat dissipating portions thereof, such as fins, radiators or the like.

BRIEF SUMMARY OF THE INVENTION

The object of the present invention is to provide an electric device, such as a transformer, a motor, a fan, or the like, configured for optimizing the heat removal, so to reduce the overall dimensions and costs of the device.

This and other objects are achieved by an electric device in accordance with claim 1.

Dependent claims define possible advantageous embodiments of the invention.

BRIEF DESCRIPTION OF THE DRAWINGS

Further characteristics and advantages of the electric device according to the invention will be more apparent from the following description of preferred embodiments given as a way of an example with reference to the enclosed drawings in which.

DETAILED DESCRIPTION

With reference to the annexed Figures, an electric device in general is indicated with reference 1. The electric device within the meaning of the present invention can include for example transformers, motors, fans, and parts thereof, such as conductors, a core, windings, a tank, radiators.

The electric device 1 in general comprises at least one portion generating heat and at least one portion for dissipating the heat generated by said heat generating portion. The heat is mainly generated due to electric phenomena, such as Joule effect, Eddy currents, hysteresis, or the like. In order to remove heat, the heat dissipating portion is in a heat exchange relationship, for example in contact, with a fluid. The fluid in general can include a liquid, such as oil, an ester or silicone, or a gas such as $SF_6$ (Sulfur hexafluoride), or air. For example, in case of dry-type transformers, heat is removed by environmental air in contact with the transformer active part, which generates heat. It is however to be noted that sometimes heat is removed through a primary fluid and a secondary fluid. In particular, the heat generating portion can be in a heat exchange relationship with a primary fluid, which in turn is in a heat exchange relationship with the heat dissipating portion which is in a heat exchange relationship with a secondary fluid. For example, in mineral oil filled transformers, the oil flows around the active part, which generates heat. Heat is conveyed from the mineral oil to the cooling system, such as radiators, heat exchangers and the like. Then heat is conveyed from the cooling system to the environmental fluid, such as air or water. In general, therefore, primary fluids can include oil, ester, silicone, air, $SF_6$ (Sulfur hexafluoride), whereas secondary fluids can include air or water.

Figure 1:
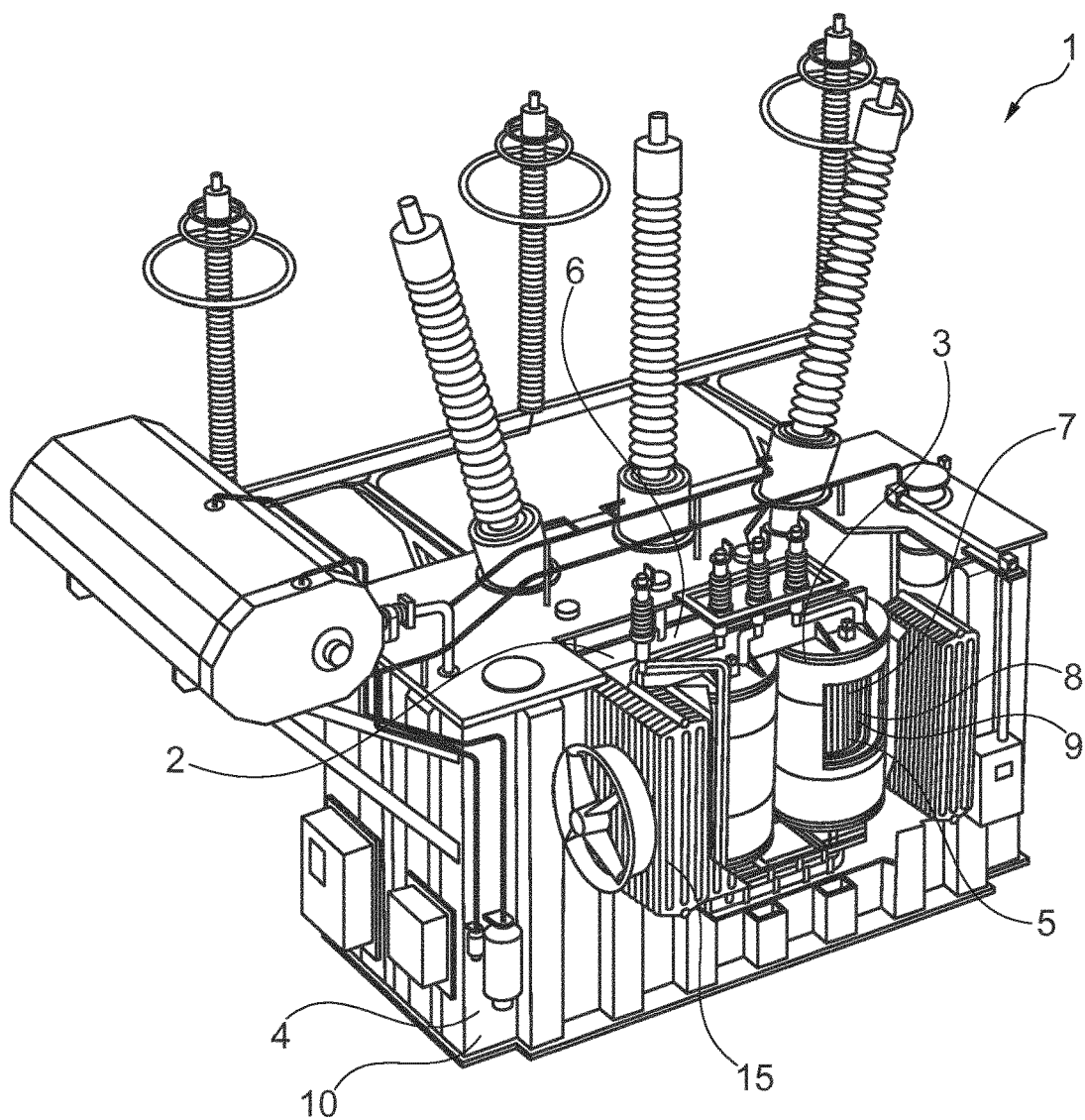
FIG. 1 shows a perspective, partially sectional, view of a transformer according to an embodiment of the invention.

With reference for example to a transformer (FIG. 1), it includes a core 2 and one or more windings 3 mounted to the core 2, wherein each winding comprises at least a low voltage winding and at least a high voltage winding. Depending on the type of transformer, the windings can include cast coils, foil windings, layer windings, helical windings, disc windings, or foil-disc windings. The transformer can be placed in a tank 4 filled with oil if it is of the oil immersed type, or any other suitable fluid, as described above. In a transformer, the heat generating portions can for example include: the core 2 and any metallic clamping structure thereof, the windings 3, conductors connecting parts thereof, tank walls.

In this exemplary arrangement, the heat dissipating portions can for example include: internal cooling ducts 5 of the core 2, the core outer surfaces 6, windings internal cooling ducts 7, windings outer surfaces 8, insulated conductors 9, internal or external tank walls 10, fins 15.

It is to be noted that in a transformer the above heat dissipating portions can be in heat exchange relationship with air (for example the fins) or with oil (for example the internal tank walls).

According to the invention, the above cited heat dissipating portions comprise means for generating a turbulent flow in the fluid in contact with the heat dissipating portion itself. Indeed, usually the fluid in contact with the heat dissipating portions is laminar. If on the contrary the flow pattern is turbulent, the heat exchange with the fluid can be increased. As a consequence, for example it is possible to reduce the dimensions of heat exchanging surfaces.

The means for generating the turbulent flow can be configured in several manners.

Figure 2:
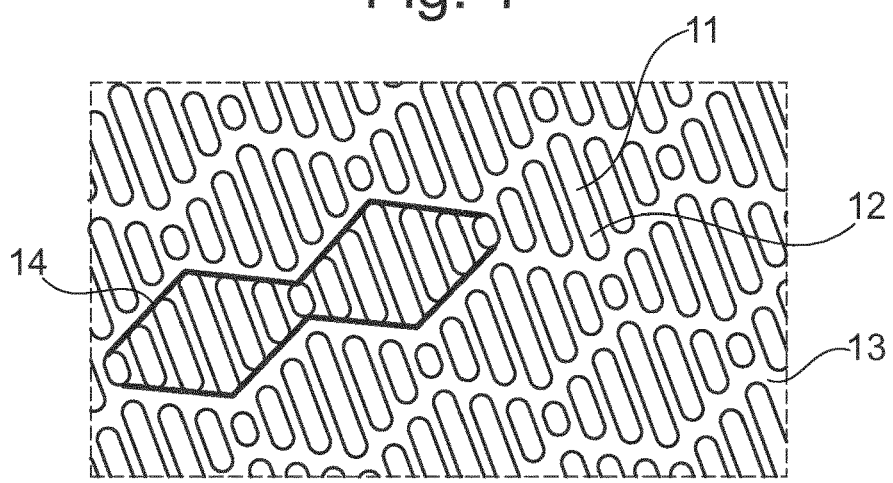
FIG. 2 shows a schematic view of means for generating a turbulent flow on heat dissipating portions such as internal cooling ducts, core outer surfaces, winding internal cooling ducts, winding outer surfaces, insulated conductors, internal or external tank walls, fins, and the like according to a possible embodiment of the invention.

In accordance with a possible embodiment, the means for generating the turbulent flow comprise denticles 11 positioned so to be in contact with the fluid (FIG. 2). Thus, the denticles can be added to the heat dissipating portions (e.g., internal cooling ducts 5 of the core 2, the core outer surfaces 6, windings internal cooling ducts 7, windings outer surfaces 8, insulated conductors 9, internal or external tank walls 10, fins 15).

In accordance with a possible embodiment, the denticles 11 comprise ribs 12 positioned so to be in contact with the fluid. The ribs 12 comprise elongated bodies developing longitudinally on the heat dissipating portion surface 13 (e.g., on the surface of the internal cooling ducts 5 of the core 2, on the surface of the core outer surfaces 6, on the surface of windings internal cooling ducts 7, on the surface of windings outer surfaces 8, on the surface of insulated conductors 9, on the surface of internal or external tank walls 10, and/or on the surface of fins 15). The main longitudinal dimension of the ribs is in particular parallel to the heat dissipating portion surface 13, whilst ribs 12 height protrude transversally from the heat dissipating portion surface 13. According to a possible embodiment, the means for generating the turbulent flow comprise a plurality of said ribs 12, preferably oriented parallel one to each other. Still more preferably, the ribs 12 are oriented such that their longitudinal direction is transversal to the fluid main flow direction, if the latter is known (for example in case of a forced flow around the heat dissipating portions). According to a possible embodiment, the ribs 12 are grouped in a plurality of groups, wherein each group comprises a plurality of parallel ribs 12. Advantageously, in each group the ribs 12 are dimensioned differently, such that their ends define two opposite sinusoidal waves 14.

Figure 3:
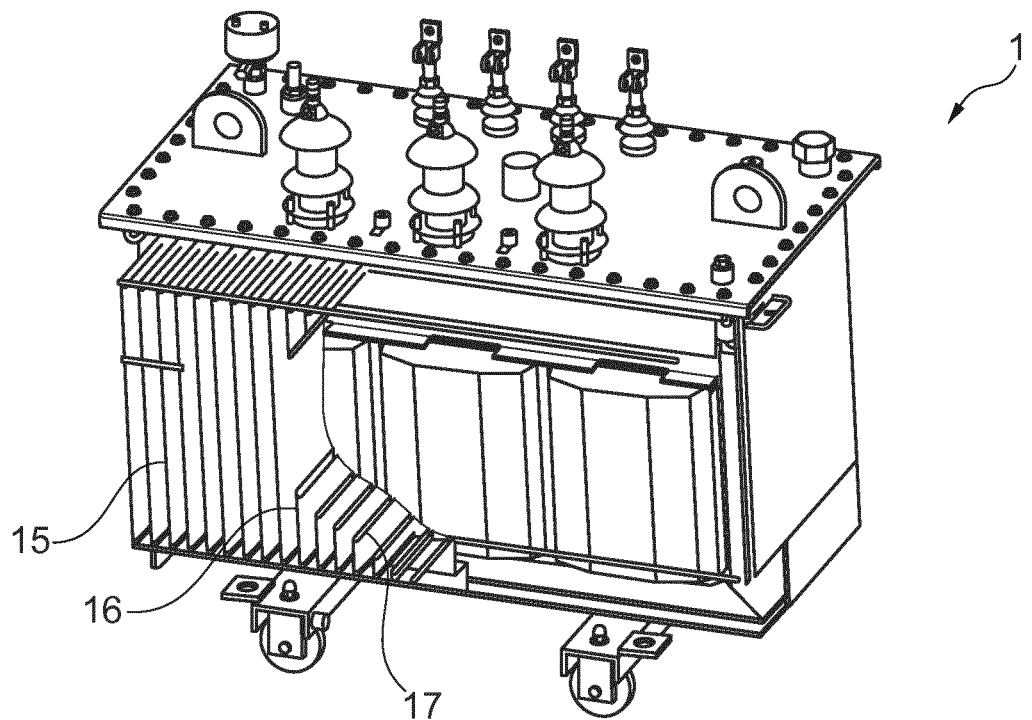
FIG. 3 shows a perspective, partially sectional, view of a transformer according to a further possible embodiment of the invention.

In accordance with another embodiment, the means for generating the turbulent flow comprise corrugations on a surface of the heat dissipating portions, destined to be in contact with the fluid. To this regard, see for example the exemplary embodiment shown in FIG. 3. The transformer in FIG. 3 comprises tank walls having corrugations 15 extending thereon externally. The corrugations 15 can be formed by a plate which is bended so to assume, in transversal section, a shape alternating peaks 16 and valleys 17. Each corrugation 15 extends preferably parallel to the next one developing transversally to the heat dissipating portion surface, in this case transversally from the respective tank wall 10. It is to be noted that in this embodiment corrugations 15 also form fins. The same fins arrangement can be provided in a radiator of an electric machine of different type, such as an electric motor or a fan.

Figure 10:
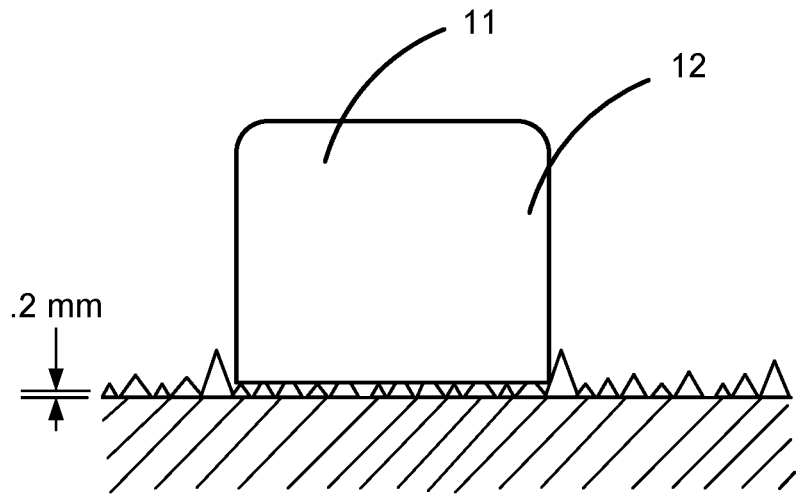
FIG. 10 illustrates a surface of the heat dissipating portion having a surface roughness of greater than 0.2 mm and a rib of FIG. 2 according to some embodiments.
Figure 11:
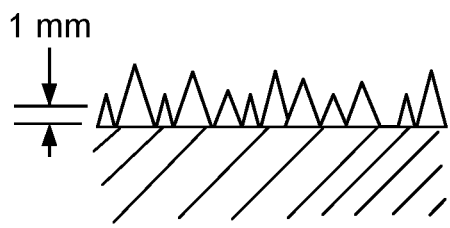
FIG. 11 illustrates a surface of the heat dissipating portion having a surface roughness of greater than 1 mm according to some embodiments.
Figure 12:
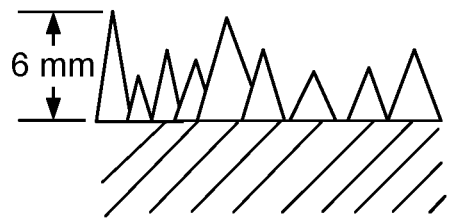
FIG. 12 illustrates a surface of the heat dissipating portion having a surface roughness of greater than or equal to 6 mm according to some embodiments.

It is also to be noted that, according to further possible embodiments, corrugations can be more generally intended also with the meaning of high roughness surfaces. In other words, the heat dissipating portions in general can have high roughness surfaces forming the means for generating the turbulent flow, which can be obtained in several manners, for example by tooling the surface in a suitable manner, by printing the surface, or by spot painting a proper insulating material on the surface of the heat dissipating portion. Preferably, the high roughness surfaces have a roughness greater than 0.2 mm (see, e.g., FIG. 10), still more preferably greater than 1 mm (see, e.g., FIG. 11). Advantageously, the roughness does not exceed 6 mm (see, e.g., FIG. 12).

According to a possible embodiment, the above described fins 15 in turn can have a high roughness with the values disclosed above.

In accordance with a further possible embodiment, the means for generating the turbulent flow comprise a net made of wire to be applied on the surface of the heat dissipating portion or to be wrapped around the heat dissipating portion. The net can be arranged in a netting tape.

It is to be noted that the above cited means for generating the turbulent flow can be positioned on conductive surfaces (such as fins, tank walls), on insulating surfaces (for example paper for insulating conductors), as well as in the cooling ducts.

In the following some further exemplary embodiments of electrical devices according to the invention will be described.

Figure 4:
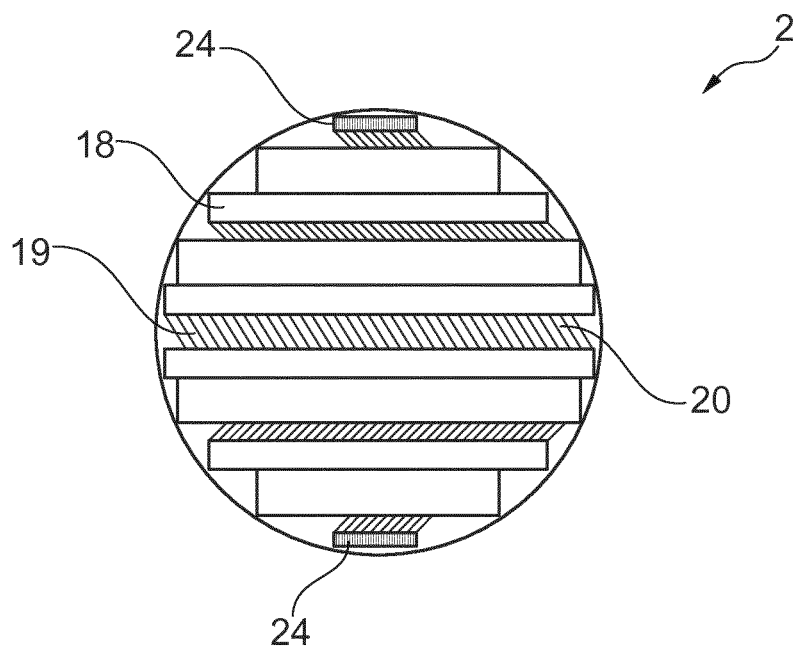
FIG. 4 shows a schematic sectional view of a transformer core according to a possible embodiment of the invention.

In FIG. 4 a sectional view of core 2 according to an exemplary embodiment is shown. According to this embodiment, the core 2 comprises a plurality of lamination blocks 18 arranged between two opposite clamp plates 24. Here the lamination blocks peripheries approximates a substantially circular shape where windings can be wounded. Inside the core, cooling ducts 19 are formed. The cooling ducts 19 may be the same cooling ducts as internal cooling ducts 5. In particular, some lamination blocks 18 are spaced and the cooling ducts 19 are positioned or formed in the spaces 20 therebetween. The cooling ducts 19 extend longitudinally inside the core and a cooling fluid, such as oil, flows inside them. Inside the cooling ducts 19, means for generating a turbulent flow in the cooling fluid, such as denticles or ribs of the types described above, or high roughness surfaces as discussed above, or of the types which will be described below, are provided. Furthermore, such means for generating a turbulent flow in the air or in the oil can be provided in the core outer surfaces.

Figure 5:
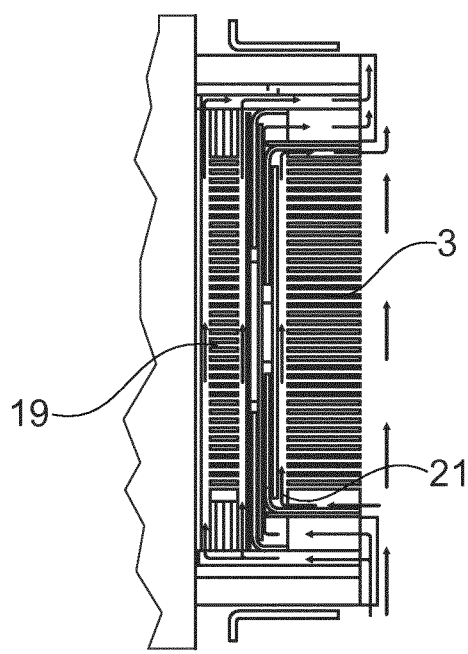
FIG. 5 shows a sectional view of a detail of a transformer winding of FIG. 1 according to a possible embodiment of the invention.
Figure 6:
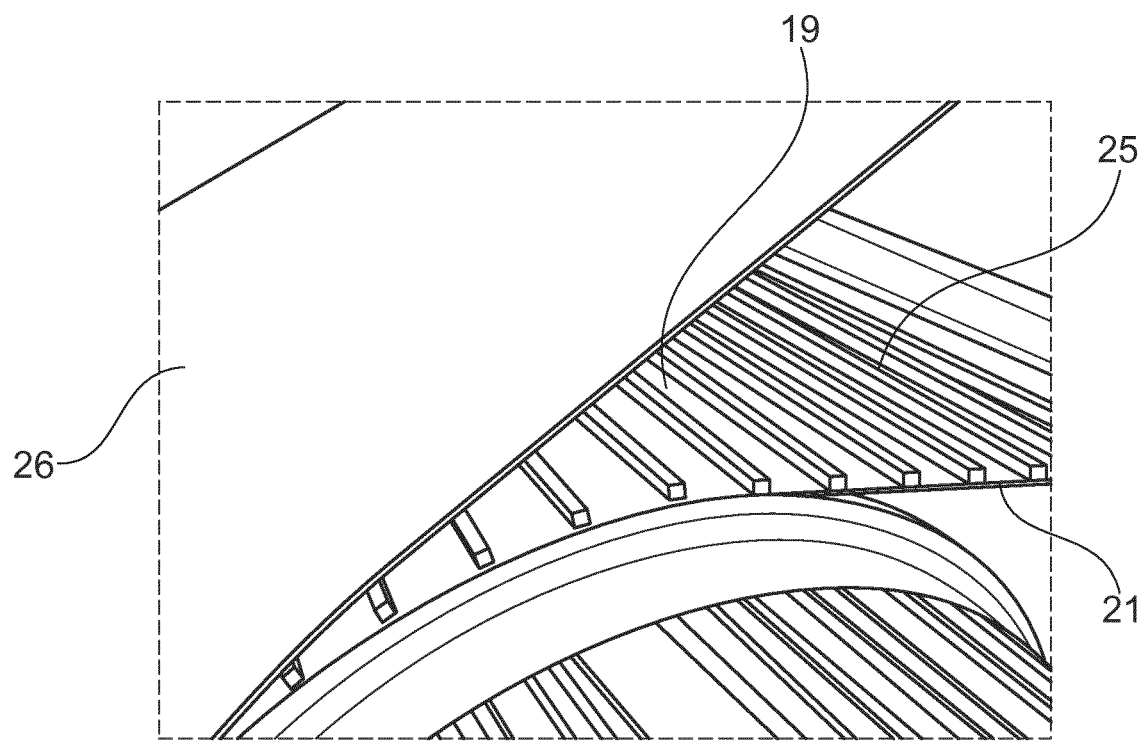
FIG. 6 shows a partial perspective view of a detail of a transformer winding according to a further possible embodiment of the invention.

In FIGS. 5-6 cooling ducts 19 within windings 3 are shown in two possible embodiments. The winding turns are separated by insulating walls 21. In a first embodiment (FIG. 5), layer windings 3 are provided and cooling ducts 19 develop axially in or between the insulating walls 21, which can be provided with the means for generating turbulent flow. In a second embodiment (FIG. 6), foil windings 26 are provided and cooling ducts 19 extend longitudinally along the insulating walls 21. The cooling ducts 19 can be formed for example between adjacent spacing ribs 25 formed in the insulating walls 21. The cooling ducts 19 in both embodiments are provided with means for generating turbulent flow in the fluid flowing in the cooling ducts 19. Additionally, means for generating a turbulent flow can be provided on the windings outer surfaces, for example in cast coils. This also improves the dielectric performance, in particular a higher creep strength is obtained.

Figure 7:
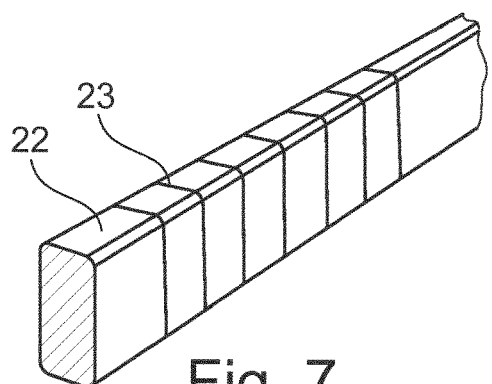
FIG. 7 shows a perspective view of a means for generating a turbulent blow being a net wrapped around a conductor strand (e.g., a transformer winding) according to a possible embodiment of the invention.
Figure 8:
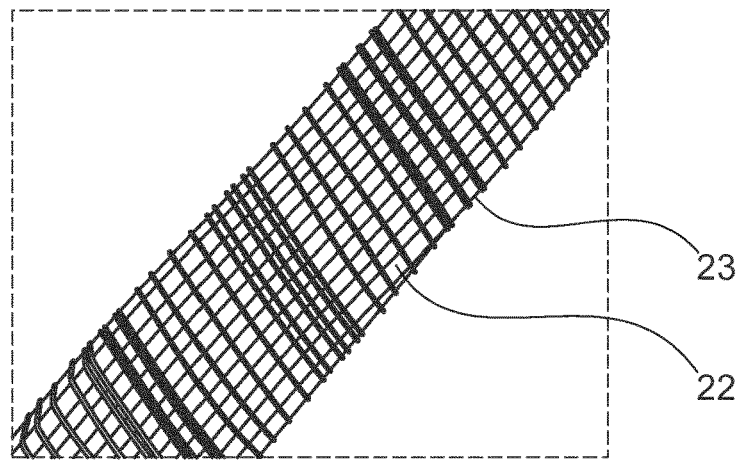
FIG. 8 shows a side view of a means for generating a turbulent blow being a net wrapped around a continuously transposed cable (e.g., a transformer winding) according to a possible embodiment of the invention.
Figure 9:
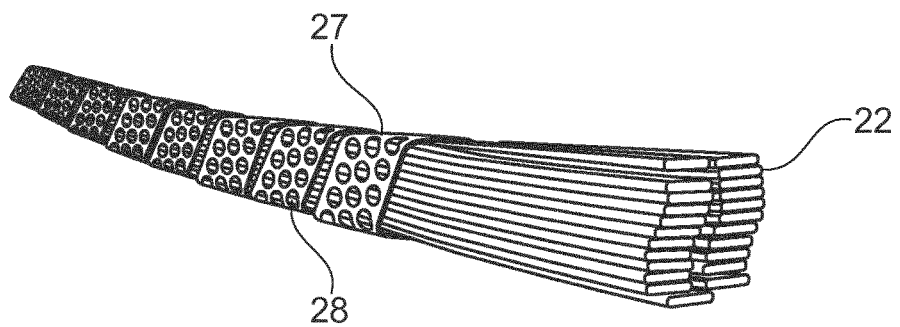
FIG. 9 shows a perspective view of a means for generating a turbulent blow being a netting tape wrapped around a continuously transposed cable (e.g., transformer winding) according to another possible embodiment of the invention.

In FIGS. 7-9 conductors 22 are shown. In the embodiment shown in FIG. 7, the means for generating the turbulent flow is a net 23 made of wire that is applied on the heat dissipating portion or wrapped around the heat dissipating portion such as being wrapped around the conductor 22, forming the means for generating the turbulent flow. In the embodiment shown in FIG. 8, the net 23 is wrapped on a continuously transposed cable, whilst in the embodiment in FIG. 9, the means for generating the turbulent flow is a netting tape 27 that is wrapped on a continuously transposed cable. The netting tape 27 can carry a net, or be configured as a net itself, for example it can comprise a plurality of holes 28. In all the above described cases, the net and the netting tape are configured to increase the surface roughness and therefore realize means for generating a turbulent flow.

To the above-mentioned embodiments of electric device according to the invention, the skilled person, in order to meet specific current needs, can make several additions, modifications, or substitutions of elements with other operatively equivalent elements, without however departing from the scope of the appended claims.

The invention claimed is:

1. An electric device comprising a portion generating heat and at least one heat dissipating portion for dissipating said generated heat by heat exchange with a fluid, wherein said at least one heat dissipating portion comprises means for generating a turbulent flow in the fluid,
wherein the means for generating the turbulent flow comprises ribs positioned so to be in contact with the fluid where a plurality of the ribs are oriented parallel one to each other, wherein each of the ribs is a solid elongated body that develops longitudinally on a single surface side of the at least one heat dissipating portion and is orientated in a longitudinal direction that is transversal to the main flow direction of the fluid,
wherein the ribs of said plurality of ribs are grouped in a plurality of groups, wherein each group comprises a plurality of parallel ribs, the ribs in each group being dimensioned such that their ends across the group define two opposite sinusoidal waves, wherein a first group having two opposite first sinusoidal waves is in a first row and a second group in a second row directly above or directly below the first row has two opposite second sinusoidal waves offset from and parallel to the two opposite first sinusoidal waves.

2. The electric device according to claim 1, wherein the means for generating the turbulent flow comprise denticles positioned so to be in contact with the fluid.

3. The electric device according to claim 1, wherein the plurality of the ribs are one a first heat dissipating portion of the at least one heat dissipating portion and the means for generating the turbulent flow further comprise corrugations on a surface of a second heat dissipating portion of the at least one heat dissipating portion.

4. The electric device according to claim 3, wherein said corrugations are formed by a plate which is bent so to assume a shape alternating peaks and valleys, wherein each corrugation extends parallel to the next one and develops transversally to a heat dissipating portion surface of the second heat dissipating portion.

5. The electric device according to claim 1, wherein a third heat dissipating portion of the at least one heat dissipating portion comprises at least a surface having a roughness greater than 0.2 mm.

6. The electric device according to claim 5, wherein the surface of the third heat dissipating portion of the at least one heat dissipating portion has a surface roughness greater than 1 mm.

7. The electric device according to claim 5, wherein the surface of the third heat dissipating portion of the at least one heat dissipating portion has a surface roughness less than or equal to 6 mm.

8. The electric device according to claim 1, wherein the plurality of the ribs comprise a first heat dissipating portion of the at least one heat dissipating portion and the means for generating the turbulent flow comprise a net made of wire or a netting tape to be applied on a surface of a second heat dissipating portion of the at least one heat dissipating portion or to be wrapped around the second heat dissipating portion.

9. The electric device according to claim 1, wherein said electric device comprises a transformer having a core and one or more windings mounted to the core, each winding comprising at least a low voltage winding and at least a high voltage winding and said heat dissipating portion comprises: core cooling ducts, and/or core outer surfaces, and/or winding outer surfaces and/or fins, and/or one or more conductors.

10. The electric device according to claim 9, wherein said core comprises a plurality of lamination blocks, at least some lamination blocks being spaced and said core cooling ducts being positioned or formed in spaces therebetween.

11. The electric device according to claim 9, wherein the transformer comprises a tank for a liquid realizing said fluid, wherein said heat dissipating portion comprises a tank wall, wherein said means for generating a turbulent flow are positioned inside and/or outside said tank wall.

12. The electric device according to claim 1, wherein said electric device is selected in the group consisting of: transformers, motors, fans.

13. The electric device according to claim 1, wherein said fluid is selected in the group consisting of: air, oil, ester, silicone, or sulfur hexafluoride.

14. The electric device according to claim 1, wherein the heat generating portion is in a heat exchange relationship with the fluid, the fluid being a primary fluid, which is in a heat exchange relationship with the heat dissipating portion, which is in a heat exchange relationship with a secondary fluid.

15. The electric device according to claim 14, wherein said primary fluid is selected in the group consisting of oil, ester, silicone, air, sulfur hexafluoride, and said secondary fluid is selected in the group consisting of: air, water.

16. The method according to claim 1, wherein the second row is directly above or directly below the first row without any rows interceding between the first row and the second row.

* * * * *